US007521669B2

(12) United States Patent
Toh et al.

(10) Patent No.: US 7,521,669 B2
(45) Date of Patent: Apr. 21, 2009

(54) MULTI-BIT ABSOLUTE POSITION OPTICAL ENCODER WITH REDUCED NUMBER OF TRACKS

(75) Inventors: Kheng Hin Toh, Penang (MY); Lee Ling Teh, Penang (MY); Chung Min Thor, Porek (MY); Boon Keat Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/445,661

(22) Filed: Jun. 2, 2006

(65) Prior Publication Data

US 2007/0278392 A1 Dec. 6, 2007

(51) Int. Cl.
*G01D 5/30* (2006.01)
(52) U.S. Cl. .............................. 250/231.14; 250/237 G; 345/165
(58) Field of Classification Search ............ 250/231.13, 250/231.14, 231.17, 231.18, 237 G; 345/165
See application file for complete search history.

(56) References Cited

U.S. PATENT DOCUMENTS 3,613,090 A * 10/1971 Mason ............................ 341/5

| 5,069,547 | A | * | 12/1991 | Huggins et al. ............. 356/617 |
| 5,274,229 | A | * | 12/1993 | Khan ....................... 250/231.18 |
| 5,699,058 | A | | 12/1997 | Yanagisawa et al. |
| 5,748,181 | A | * | 5/1998 | Fu et al. ....................... 345/165 |
| 5,929,789 | A | * | 7/1999 | Barbehenn .................... 341/11 |
| 2005/0088667 | A1 | | 4/2005 | Yeo |
| 2005/0133705 | A1 | | 6/2005 | Hare et al. |
| 2005/0199790 | A1 | * | 9/2005 | Sheu et al. ............. 250/231.13 |
| 2005/0236560 | A1 | | 10/2005 | Ch'ng et al. |

FOREIGN PATENT DOCUMENTS

| DE | 19509420 | | 9/1995 |
| JP | 63250521 A | * | 10/1988 |
| WO | WO-2006/034389 | | 3/2006 |

* cited by examiner

*Primary Examiner*—Seung C Sohn

(57) ABSTRACT

An optical encoder includes a coding element having a track with a track pattern that comprises multiple optically distinguishable sections. The optical encoder compares photodetector outputs with transition-specific thresholds that correspond to transitions between the optically distinguishable sections of the track. The comparisons are used to determine when the transition between two optically distinguishable sections of the track has passed the photodetector. Knowledge of the transition between two optically distinguishable sections is then translated into digital position information.

20 Claims, 11 Drawing Sheets

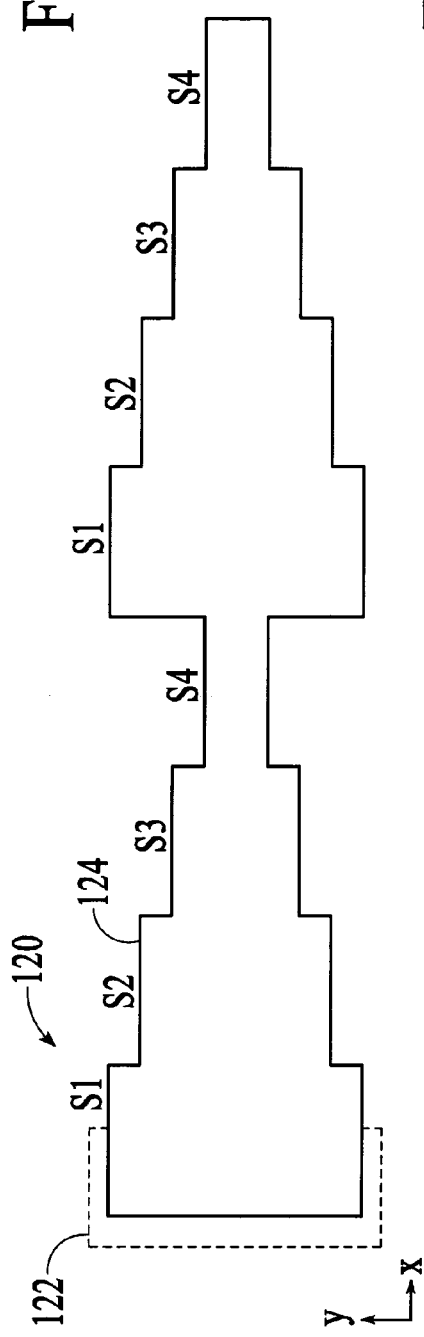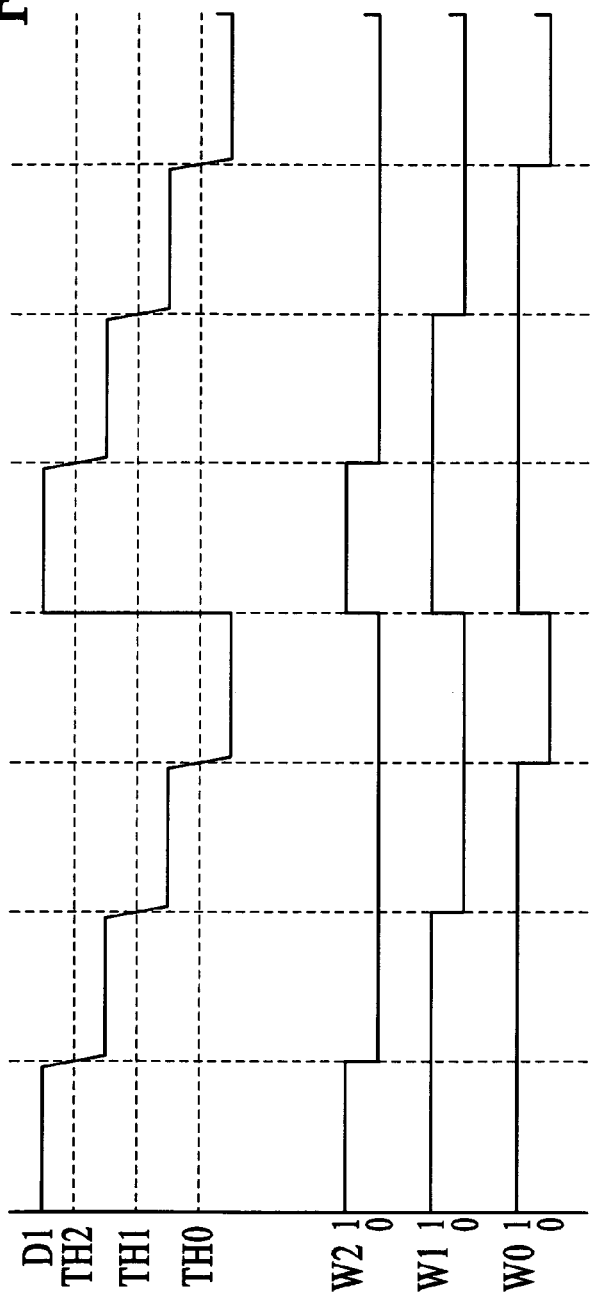

| W2 | W1 | W0 | Track | Digital Position Information |
|---|---|---|---|---|
| 1 | 1 | 1 | S1 | 00 |
| 0 | 1 | 1 | S2 | 01 |
| 0 | 0 | 1 | S3 | 10 |
| 0 | 0 | 0 | S4 | 11 |
| 1 | 1 | 1 | S1 | 00 |
| 0 | 1 | 1 | S2 | 01 |
| 0 | 0 | 1 | S3 | 10 |
| 0 | 0 | 0 | S4 | 11 |

| W5 | W4 | W3 | W2 | W1 | W0 | Subtrack | Digital Position Information |
|----|----|----|----|----|----|----------|------------------------------|
| 1 | 1 | 1 | 1 | 1 | 1 | S1,S5 | 0000 |
| 1 | 1 | 1 | 0 | 1 | 1 | S1,S6 | 0001 |
| 1 | 1 | 1 | 0 | 0 | 1 | S1,S7 | 0010 |
| 1 | 1 | 1 | 0 | 0 | 0 | S1,S8 | 0011 |
| 0 | 1 | 1 | 1 | 1 | 1 | S2,S5 | 0100 |
| 0 | 1 | 1 | 0 | 1 | 1 | S2,S6 | 1001 |
| 0 | 1 | 1 | 0 | 0 | 1 | S2,S7 | 0110 |
| 0 | 1 | 1 | 0 | 0 | 0 | S2,S8 | 0111 |
| 0 | 0 | 1 | 1 | 1 | 1 | S3,S5 | 1000 |
| 0 | 0 | 1 | 0 | 1 | 1 | S3,S6 | 1001 |
| 0 | 0 | 1 | 0 | 0 | 1 | S3,S7 | 1010 |
| 0 | 0 | 1 | 0 | 0 | 0 | S3,S8 | 1011 |
| 0 | 0 | 0 | 1 | 1 | 1 | S4,S5 | 1100 |
| 0 | 0 | 0 | 0 | 1 | 1 | S4,S6 | 1101 |
| 0 | 0 | 0 | 0 | 0 | 1 | S4,S7 | 1110 |
| 0 | 0 | 0 | 0 | 0 | 0 | S4,S8 | 1111 |

FIG.6

| W2 | W1 | W0 | Subtrack | Output | | |
|---|---|---|---|---|---|---|
| | | | | U | V | W |
| 1 | 1 | 1 | S1,S3 | 1 | 0 | 1 |
| 1 | 0 | 1 | S1,S4 | 1 | 0 | 0 |
| 1 | 0 | 0 | S1,S5 | 1 | 1 | 0 |
| 0 | 1 | 1 | S2,S3 | 0 | 1 | 0 |
| 0 | 0 | 1 | S2,S4 | 0 | 1 | 1 |
| 0 | 0 | 0 | S2,S5 | 0 | 0 | 1 |

MULTI-BIT ABSOLUTE POSITION OPTICAL ENCODER WITH REDUCED NUMBER OF TRACKS

BACKGROUND OF THE INVENTION

Optical encoders are used to monitor the motion of, for example, a shaft such as a crankshaft. Optical encoders can monitor the motion of a shaft in terms of position and/or number of revolutions of the shaft. Optical encoders typically use a codewheel attached to the shaft to modulate light as the shaft and the codewheel rotate. The light is modulated as it passes through a track on the codewheel that includes a pattern of transparent and opaque sections. As the light is modulated in response to the rotation of the codewheel, a stream of electrical signals is generated from a photodetector array that receives the modulated light. The electrical signals are used to determine the position and/or number of revolutions of the shaft.

Optical encoders that are used to determine absolute position typically have a separate track for each bit of resolution that is desired. For example, an encoder with 4-bit resolution would require four different tracks, with each track requiring its own photodetector. The tracks must be separated from each other by enough distance that light from the different tracks does not mix at the photodetectors. Optical encoders are employed in systems that desire high resolution with tight size limitations. Because the resolution of conventional optical encoders is a function of the number of tracks, what is needed is an optical encoder that can generate multi-bit resolution with a reduced number of tracks.

SUMMARY OF THE INVENTION

An optical encoder includes a coding element having a track with a track pattern that comprises multiple optically distinguishable sections. The optical encoder compares photodetector outputs with transition-specific thresholds that correspond to transitions between the optically distinguishable sections of the track. The comparisons are used to determine when the transition between two optically distinguishable sections of the track has passed the photodetector. Knowledge of the transition between two optically distinguishable sections is then translated into digital position information.

An embodiment of an optical encoder includes a coding element having a track with a track pattern, the track pattern comprising multiple optically distinguishable sections, a light source configured to output light to the track, a photodetector positioned to detect light from the light source that is associated with the track, the photodetector generating an output signal in response to detected light, threshold logic configured to indicate the magnitude of the output signal relative to at least one transition-specific threshold, wherein the at least one transition-specific threshold corresponds to a transition between optically distinguishable sections of the track, and position logic configured to generate digital position information in response to the indication from the threshold logic.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 2A depicts an embodiment of a track and photodetector that are configured to provide absolute position information with 2-bit resolution using only one track in accordance with an embodiment of the invention.

FIG. 2B depicts a wave diagram that is generated as the track pattern of FIG. 2A moves relative to the photodetector.

FIG. 6 is a matrix that illustrates an exemplary conversion of the state signals W0-W5 from FIG. 5B to digital position information.

Throughout the description similar reference numbers may be used to identify similar elements.

DETAILED DESCRIPTION OF THE INVENTION

Figure 1:
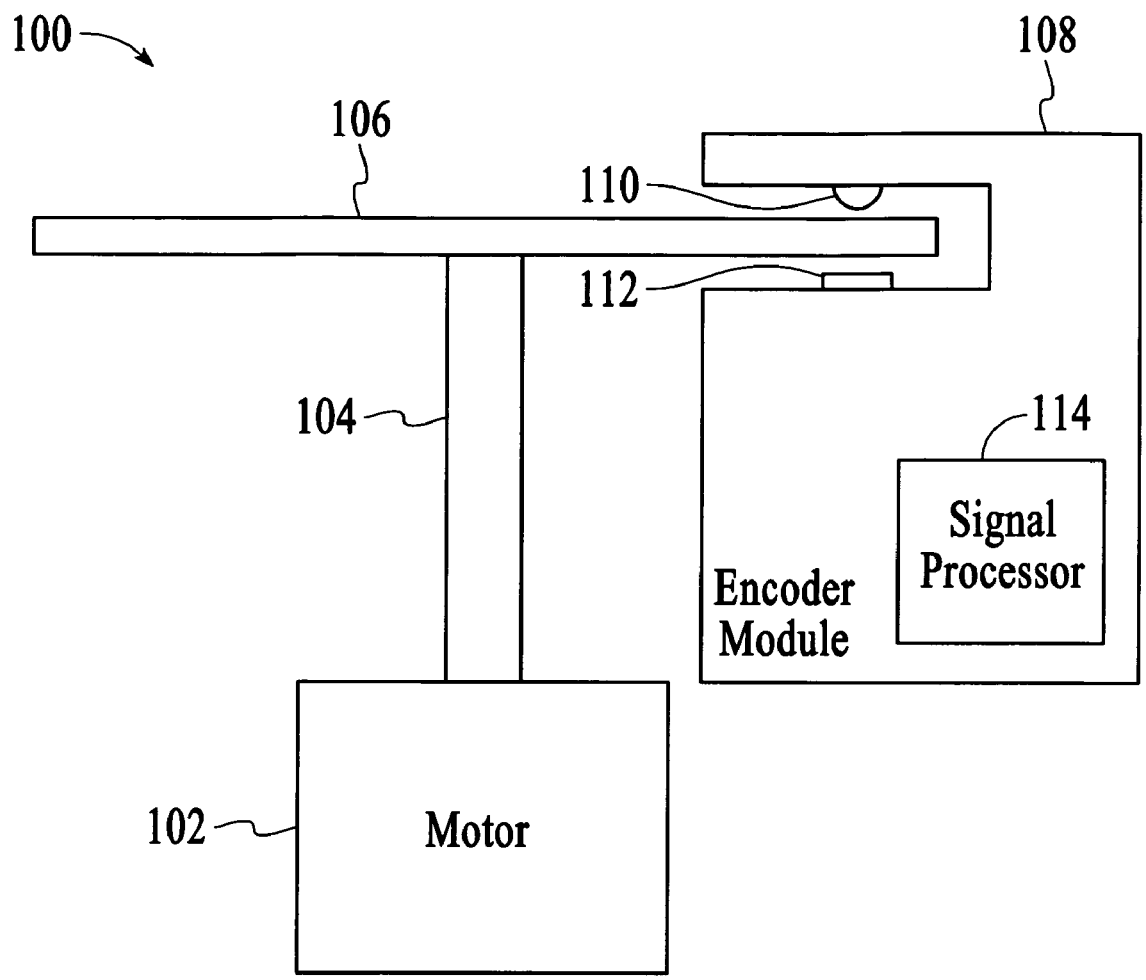
FIG. 1 depicts an optical encoder system for determining the absolute position of a shaft.

FIG. 1 depicts an optical encoder system 100 for determining the absolute position of a shaft. The optical encoder system includes a motor 102, a shaft 104, a codewheel 106, and an encoder module 108. The codewheel includes at least one track (not shown) for use in determining absolute position and the encoder module includes a light source 110, a photodetector module 112, and a signal processor 114.

The light source 110 provides light to the track or tracks of the codewheel 106. The light source may be, for example, a single light emitting diode (LED) or multiple LEDs. The photodetector module 112 includes a photodetector or photodetectors that are associated with track or tracks of the codewheel. In the embodiment of FIG. 1, the light source and photodetector module are aligned with the track or tracks such that light from the light source is detected by the photodetector module after the light passes through or reflects off the corresponding track or tracks. There may be only one photodetector associated with each track or multiple photodetectors associated with each track. The photodetectors of the photodetector module may be on the same integrated circuit (IC) or different ICs. Exemplary configurations of photodetectors are described in more detail below.

The track or tracks of the codewheel 106 may include transparent sections or reflective sections. In the case where a track includes transparent sections, the light source 110 and photodetector module 112 are located on opposite sides of the codewheel such that light passing through the transparent sections of the codewheel is detected by the corresponding photodetector or photodetectors. In the case where a track includes reflective sections, the light source and photodetector module are located on the same side of the codewheel such that light reflecting off of the codewheel is detected by the corresponding photodetector or photodetectors.

The signal processor 114 processes the electrical signals that are output by the photodetector or photodetectors of the photodetector module 112. Exemplary embodiments of the signal processor are described in more detail below.

In accordance with an embodiment of the invention, an optical encoder includes a coding element having a track with a track pattern that comprises multiple optically distinguishable sections. The optical encoder compares photodetector outputs with transition-specific thresholds that correspond to transitions between the optically distinguishable sections of the track. The comparisons are used to determine when the transition between two optically distinguishable sections of the track has passed the photodetector. Knowledge of the transition between two optically distinguishable sections is then translated into digital position information.

FIG. 2A depicts an embodiment of a track 120 and photodetector 122 that are configured to provide absolute position information with 2-bit resolution using only one track. With reference to FIG. 2A, the track has a track pattern 124 that includes a repeating pattern of four optically distinguishable sections identified in FIG. 2A as sections S1, S2, S3, and S4. The four optically distinguishable sections in each interval are configured as four adjoining rectangles of progressively smaller size. In this embodiment, the four adjoining rectangles have the same width dimensions but progressively smaller height dimensions. The progressively smaller height dimensions result in adjoining sections that have progressively smaller areas. In particular, the area of section S1 is larger than the area of section S2, the area of section S2 is larger than the area of section S3 and so on. As depicted in FIG. 2A, there is a transition between each optically distinguishable section that results from the difference between the heights of two adjacent sections. In particular, there is a transition of the total area of adjacent sections between sections S1 and S2, a transition of the total area of adjacent sections between sections S2 and S3, and a transition of the total area of adjacent sections between sections S3 and S4. There is also a transition of the total area of adjacent sections between adjacent intervals of the repeating pattern. In particular, there is a transition of the total area between section S4 of the first interval and section S1 of the second interval. As is described in more detail below, changes in the output signal of the photodetector occur as a result of these transitions.

If the track 120 utilizes a transparent track pattern 124, then the optically distinguishable sections have progressively smaller transparent areas and if the track utilizes a reflective pattern, then the optically distinguishable sections have progressively smaller reflective areas. Although only a portion of the track pattern is depicted in FIG. 2A, the track pattern can be repeated continuously around the codewheel 106 or located intermittently around the codewheel.

The sections of the track pattern 124 are optically distinguishable from each other if the output signal from the photodetector 122 can be distinguished when the photodetector is separately aligned with two adjacent sections of the track. For example, if the photodetector output signal when the photodetector is aligned with section S1 is distinguishable from the photodetector output signal when the photodetector is aligned with section S2, then the respective sections of the track pattern are optically distinguishable from each other. In an embodiment, the photodetector output signal is distinguished by comparing the photodetector output signal to transition-specific thresholds that correspond to the transitions between sections. This process is described in more detail below.

The configurations of the track pattern 124 and the photodetector 122 relative to each other are important design parameters that must be considered to ensure that the different sections of the track pattern are in fact optically distinguishable from each other. In the embodiment of FIG. 2A, the width of the photodetector is less than the width of each of the optically distinguishable sections. This design feature ensures that the photodetector detects light specific to only one section of the track pattern when the section of the track pattern and the photodetector are aligned. Further, in the embodiment of FIG. 2A, the height of the photodetector is greater than the height of the tallest section of the track pattern. This design feature allows for some tolerance in the y-axis alignment between the photodetector and the track pattern. Further, in the embodiment of FIG. 2A, the track pattern, light source, and photodetector are configured such that a sufficiently strong output signal is generated by the photodetector particularly when the photodetector is aligned with the optically distinguishable section with the smallest transparent/reflective area. For example, the photodetector must generate a sufficiently large output signal when the photodetector is aligned with section S4 of the track pattern.

FIG. 2B depicts a wave diagram that is generated as the track pattern 124 moves relative to the photodetector 122. The waveforms in the wave diagram are time aligned with the track pattern and include the photodetector output signal D1 and state signals W0, W1, and W2, where state signal W0 is an indication of the photodetector output signal relative to the transition-specific threshold TH0, state signal W1 is an indication of the photodetector output signal relative to the transition-specific threshold TH1, and state signal W2 is an indication of the photodetector output signal relative to the transition-specific threshold TH2. In the embodiment of FIG. 2B, the transition-specific threshold TH2 corresponds to the transition between optically distinguishable sections S1 and S2, the transition-specific threshold TH1 corresponds to the transition between optically distinguishable sections S2 and S3, and the transition-specific threshold TH0 corresponds to the transition between optically distinguishable sections S3 and S4. In each case, the transition-specific threshold is established at a level that is in between the level of the photodetector output signal D1 when the photodetector is aligned with the section immediately before the transition and the level of the photodetector output signal D1 when the photodetector is aligned with the section immediately following the transition. With this configuration, the photodetector output signal D1 must cross the transition-specific threshold when the alignment of the photodetector changes between two adjacent sections. The transition-specific thresholds can be established, for example, based on experimental data or based on calculations of the expected levels of the photodetector output signal.

In the embodiment of FIG. 2B, the state signals are digital signals that are high (e.g., 1) when the photodetector output signal D1 is above the respective transition-specific threshold and low (e.g., 0) when the photodetector output signal D1 is below the respective transition-specific threshold. Although one convention for the state signals is described, other conventions are possible.

In operation, the photodetector output signal D1 is initially above all of the transition-specific thresholds and therefore all of the state signals are high (e.g., 1). As the photodetector 122 passes from section S1 to section S2 (by virtue of the rotation of the codewheel 106 relative to the light source 110 and the photodetector module 112), the photodetector output signal D1 drops below the transition-specific threshold TH2. Once the photodetector output signal D1 drops below the transition-specific threshold TH2, the state signal W2 goes from high to low (e.g., from 1 to 0). The state signal W2 stays low until the photodetector output signal D1 rises back above the transition-specific threshold TH2.

As the photodetector 122 passes from section S2 to section S3 (by virtue of the rotation of the codewheel 106 relative to the light source 110 and the photodetector module 112), the photodetector output signal D1 drops below the transition-specific threshold TH1. Once the photodetector output signal D1 drops below the transition-specific threshold TH1, the state signal W1 goes from high to low (e.g., from 1 to 0). The state signal W1 stays low until the photodetector output signal D1 rises back above the transition-specific threshold TH1.

As the photodetector 122 passes from section S3 to section S4 (by virtue of the rotation of the codewheel 106 relative to the light source 110 and the photodetector module 112), the photodetector output signal D1 drops below the transition-specific threshold TH0. Once the photodetector output signal D1 drops below the transition-specific threshold TH0, the state signal W0 goes from high to low (e.g., from 1 to 0). The state signal W0 stays low until the photodetector output signal D1 rises back above the transition-specific threshold TH0.

As the photodetector 122 passes from section S4 of the first interval to section S1 of the second interval, the photodetector output signal D1 rises back above all three of the transition-specific thresholds, TH0, TH1, and TH2. Once the photodetector output signal D1 rises above all three of the transition-specific thresholds, all three of the state signals W0, W1, and W2 go from low to high (e.g., from 0 to 1) and the above-described process repeats itself.

Figures 3, 4:
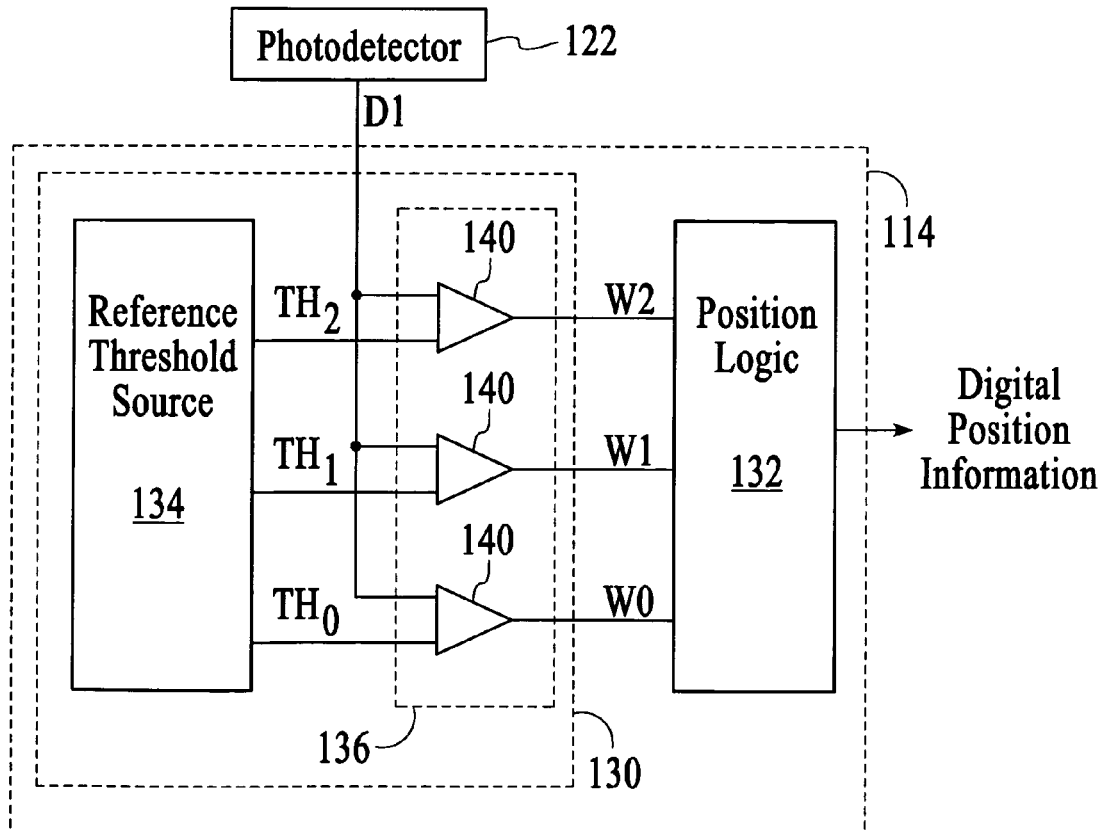
FIG. 3 is a matrix that illustrates an exemplary conversion of the state signals W0, W1, and W2 from FIG. 2B to digital position information.
FIG. 4 depicts the photodetector from FIG. 2A and an embodiment of the signal processor from FIG. 1, which can be used to implement the technique described above with reference to FIGS. 2A, 2B, and 3.

The state signals W0, W1, and W2, which represent the magnitude of the photodetector output signal D1 relative to the transition-specific thresholds, are converted to digital position information. FIG. 3 is a matrix that illustrates an exemplary conversion of the state signals W0, W1, and W2 to digital position information. The matrix includes five columns, three columns that identify the state signals W0, W1, and W2, one column that identifies the corresponding section of the track, and one column that identifies corresponding digital position information. As illustrated in the matrix, when all of the state signals are high (e.g., 1, 1, 1), the photodetector is aligned with optically distinguishable section S1. In the embodiment of FIG. 3, this combination of signal states translates to a digital position output of '00'. When the state signals W0 and W1 are high and state signal W2 is low (e.g., 0, 1, 1), the photodetector is aligned with optically distinguishable section S2, which translates to a digital position output of '01'. Similar conversions are made for sections S3 and S4 as illustrated in FIG. 3. Although a particular conversion scheme is depicted in FIG. 3, the conversion scheme can be established differently from the scheme of FIG. 3.

FIG. 4 depicts the photodetector 122 from FIG. 2A and an embodiment of the signal processor 114 from FIG. 1, which can be used to implement the technique described above with reference to FIGS. 2A, 2B, and 3. The signal processor depicted in FIG. 4 includes threshold logic 130 and position logic 132. The threshold logic receives the photodetector output signal D1 and outputs the state signals W0, W1, and W2. The position logic receives the state signals W0, W1, and W2 and outputs digital position information.

In the embodiment of FIG. 4, the threshold logic 130 includes a reference threshold source 134 and a threshold comparator unit 136. The reference threshold source provides the transition-specific thresholds TH0, TH1, and TH2 to the threshold comparator unit. In an embodiment, the transition-specific thresholds are provided to the threshold comparator unit as voltage or current signals at the appropriate levels. The threshold comparator unit compares the transition-specific thresholds to the photodetector output signal, D1. In the embodiment of FIG. 4, the threshold comparator unit includes three comparators 140, one for each transition-specific threshold. Each of the three comparators includes one input for receiving the photodetector output signal D1 and one input for receiving the corresponding transition-specific threshold.

In operation, the three comparators 140 of the threshold comparator unit 136 compare the photodetector output signal D1 to the respective transition-specific threshold, TH0, TH1, and TH2. In response to the comparison, the comparators output the state signals W0, W1, and W2 to the position logic 132 and the position logic converts the state signals to digital position information. For example, the position logic converts the state signals to digital values as described with reference to FIG. 3. Using the techniques described above with reference to FIGS. 1-4, an absolute position optical encoder with 2-bit resolution is provided using only one track.

Figure 5A:
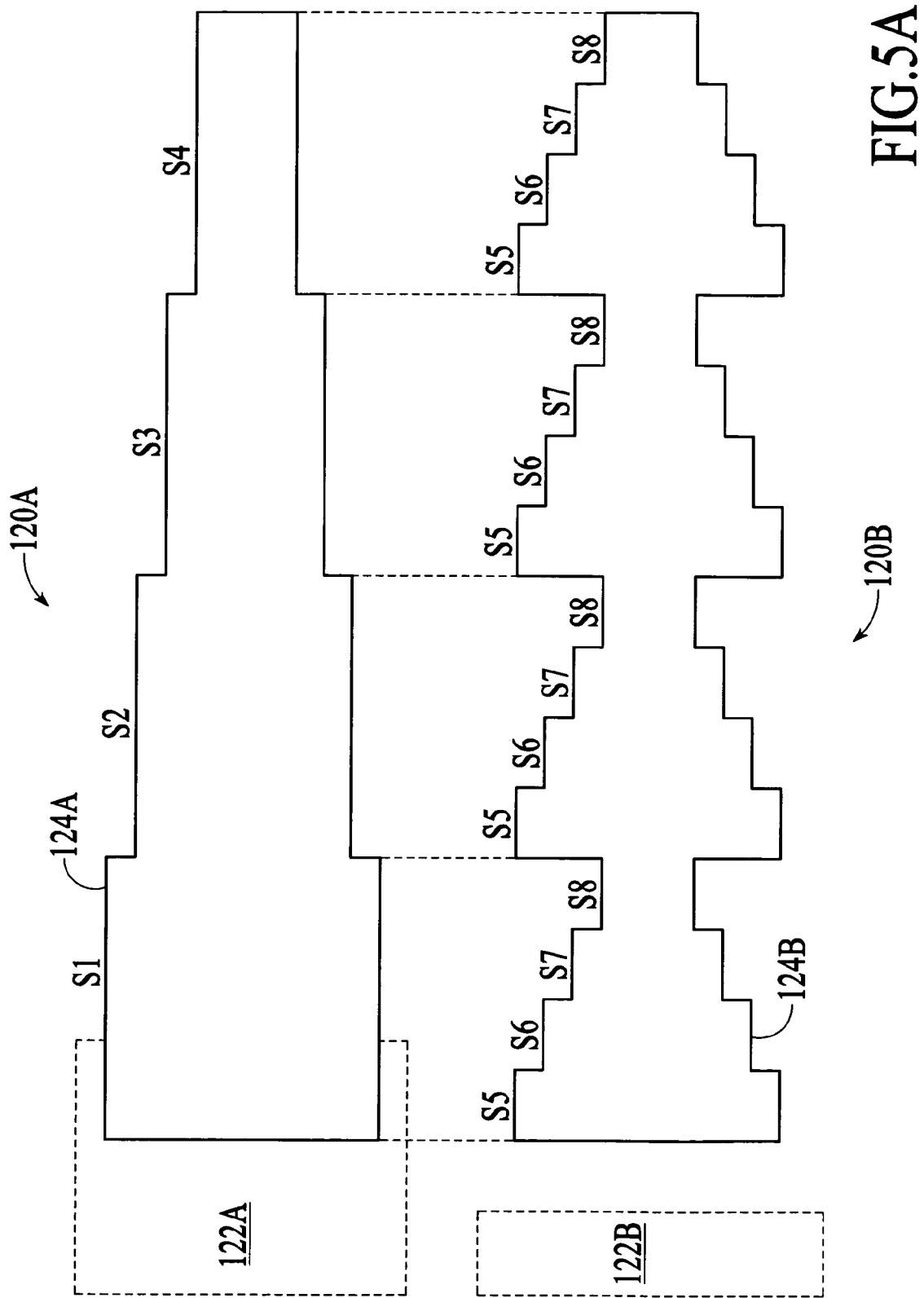
FIG. 5A depicts an exemplary embodiment of a system that is configured to provide absolute position information with 4-bit resolution using only two tracks in accordance with an embodiment of the invention.

Although the optical encoder system described with reference to FIGS. 2A-4 includes only one track, similar concepts can be applied to a multi-track optical encoder system to provide absolute position information with multi-bit resolution using a reduced number of tracks. FIG. 5A depicts an exemplary embodiment of a system that is configured to provide absolute position information with 4-bit resolution using only two tracks. With reference to FIG. 5A, a first track 120A, track A, has a track pattern 124A that includes a repeating pattern of four optically distinguishable sections, S1, S2, S3, and S4, similar to the track pattern described with reference to FIG. 2A. A second track 120B, track B, has a track pattern 124B that includes a repeating pattern of four optically distinguishable sections, S5, S6, S7, and S8, in which the pattern repeats in four intervals over the span of one interval of the pattern of track A.

As depicted in FIG. 5A, the optically distinguishable sections of tracks A and B are aligned with each other such that each section of track A is aligned with one interval of track B. For example, one interval of optically distinguishable sections S5, S6, S7, and S8 of track B is aligned with optically distinguishable section S1 of track A, one interval of optically distinguishable sections S5, S6, S7, and S8 of track B is aligned with optically distinguishable section S2 of track A, one interval of optically distinguishable sections S5, S6, S7, and S8 of track B is aligned with optically distinguishable section S3 of track A, and one interval of optically distinguishable sections S5, S6, S7, and S8 of track B is aligned with optically distinguishable section S4 of track A.

A photodetector 122A corresponds to track A 120A and a photodetector 122B corresponds to track B 120B. The photodetectors and track patterns are configured similar to that described above with reference to FIG. 2A such that the transitions between the optically distinguishable sections of the track patterns can be identified by comparing the corresponding photodetector output signals to the corresponding transition-specific thresholds. Further, the configurations of the track patterns and the photodetectors relative to each other have similar design requirements to those described above with reference to FIGS. 2A-4.

Figure 5B:
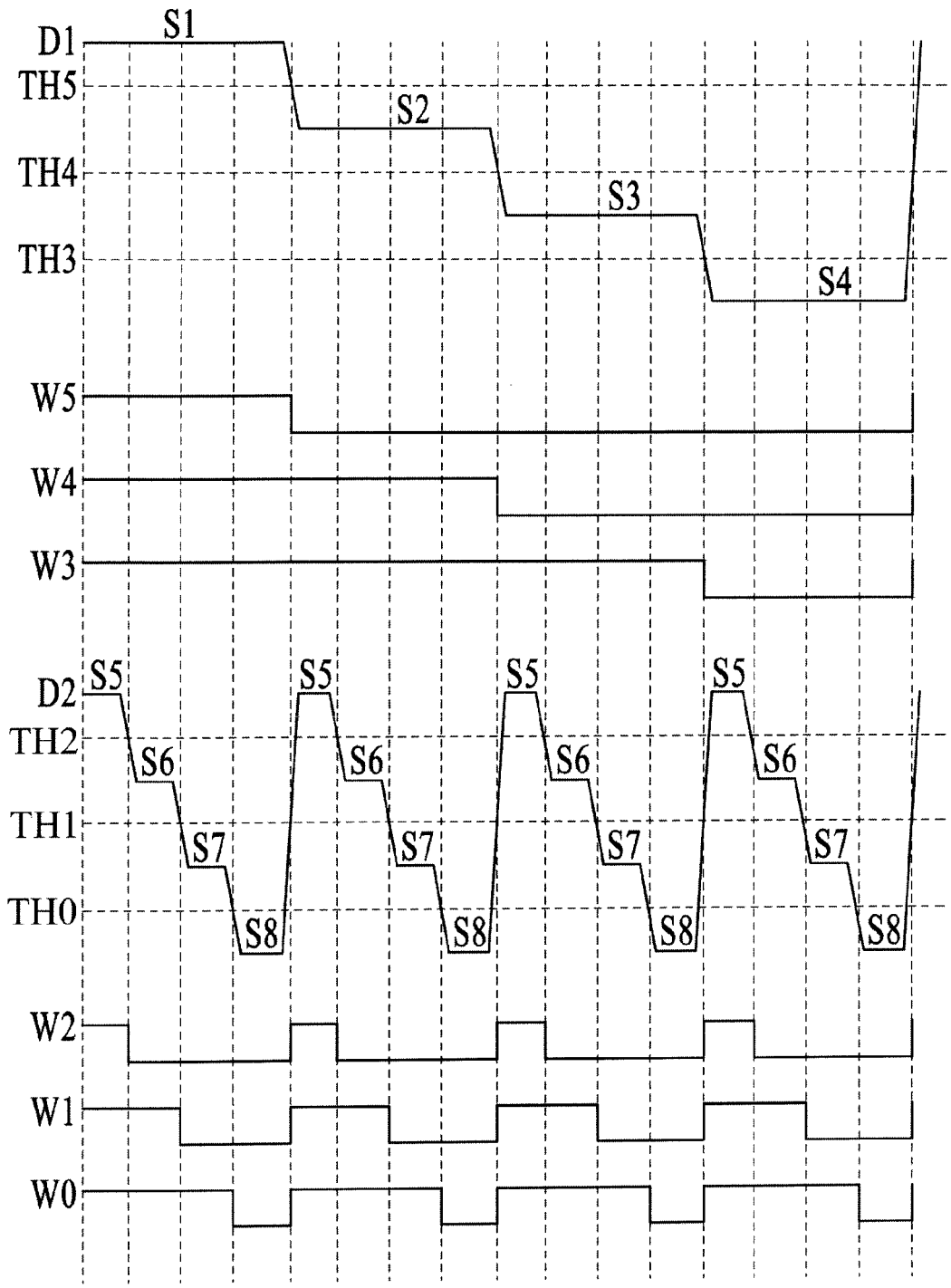
FIG. 5B depicts a wave diagram that is generated as the track patterns of tracks s A and B from FIG. 5A move relative to the photodetectors.

FIG. 5B depicts a wave diagram that is generated as the track patterns 124A and 124B of tracks A and B move relative to the photodetectors 122A and 122B. The waveforms in the wave diagram are time aligned with the track patterns and include the photodetector output signals D1 and D2 and state signals W0, W1, W2, W3, W4, and W5, where state signal W0 is an indication of the photodetector output signal relative to the transition-specific threshold TH0, state signal W1 is an indication of the photodetector output signal relative to the transition-specific threshold TH1, state signal W2 is an indication of the photodetector output signal relative to the transition-specific threshold TH2, state signal W3 is an indication of the photodetector output signal relative to the transition-specific threshold TH3, state signal W4 is an indication of the photodetector output signal relative to the transition-specific threshold TH4, and state signal W5 is an indication of the photodetector output signal relative to the transition-specific threshold TH5.

In the embodiment of FIG. 5B, the transition-specific threshold TH5 corresponds to the transition between optically distinguishable sections S1 and S2 of track A, the transition-specific threshold TH4 corresponds to the transition between optically distinguishable sections S2 and S3 of track A, and the transition-specific threshold TH3 corresponds to the transition between optically distinguishable sections S3 and S4 of track A. The transition-specific threshold TH2 corresponds to the transition between optically distinguishable sections S5 and S6 of track B, the transition-specific threshold TH1 corresponds to the transition between optically distinguishable sections S6 and S7 of track B, and the transition-specific threshold TH0 corresponds to the transition between optically distinguishable sections S7 and S8 of track B. As described above, the transition-specific thresholds are established at levels that are in between the level of the photodetector output signal when the respective photodetector is aligned with the section immediately before the transition and the level of the photodetector output signal when the respective photodetector is aligned with the section immediately following the transition.

In the embodiment of FIG. 5B, the state signals W0-W5 are digital signals that are high (e.g., 1) when the photodetector output signals D1 and D2 are above the respective transition-specific threshold and low (e.g., 0) when the photodetector output signals D1 and D2 are below the respective transition-specific threshold. Although one convention for the state signals is described, other conventions are possible.

In operation, first with reference to track A, the photodetector output signal D1 is initially above transition-specific thresholds TH3, TH4, and TH5 and therefore all of the state signals are high (e.g., 1). As the photodetector 122A passes from section S1 to section S2 (by virtue of the rotation of the codewheel relative to the light source and the photodetector module), the photodetector output signal D1 drops below the transition-specific threshold TH5. Once the photodetector output signal D1 drops below the transition-specific threshold TH5, the state signal W5 goes from high to low (e.g., from 1 to 0). The state signal W5 stays low until the photodetector output signal D1 rises back above the transition-specific threshold TH5.

As the photodetector 122A passes from section S2 to section S3 (by virtue of the rotation of the codewheel relative to the light source and the photodetector module), the photodetector output signal D1 drops below the transition-specific threshold TH4. Once the photodetector output signal D1 drops below the transition-specific threshold TH4, the state signal W4 goes from high to low (e.g., from 1 to 0). The state signal W4 stays low until the photodetector output signal D1 rises back above the transition-specific threshold TH4.

As the photodetector 122A passes from section S3 to section S4 (by virtue of the rotation of the codewheel relative to the light source and the photodetector module), the photodetector output signal D1 drops below the transition-specific threshold TH3. Once the photodetector output signal D1 drops below the transition-specific threshold TH3, the state signal W3 goes from high to low (e.g., from 1 to 0). The state signal W3 stays low until the photodetector output signal D1 rises back above the transition-specific threshold TH3.

As the photodetector 122A passes from section S4 of the first interval of track A to section S1 of the next interval of track A, the photodetector output signal D1 will rise back above all three of the transition-specific thresholds, TH3, TH4, and TH5. Once the photodetector output signal D1 rises above all three of the transition-specific thresholds, all three of the state signals W3, W4, and W5 will go from low to high (e.g., from 0 to 1) and the above-described process repeats itself.

Second, with reference to track B, the photodetector output signal D2 is initially above transition-specific thresholds TH0, TH1, and TH2 and therefore all of the state signals are high (e.g., 1). As the photodetector 122B passes from section S5 to section S6 (by virtue of the rotation of the codewheel relative to the light source and the photodetector module), the photodetector output signal D2 drops below the transition-specific threshold TH2. Once the photodetector output signal D2 drops below the transition-specific threshold TH2, the state signal W2 goes from high to low (e.g., from 1 to 0). The state signal W2 stays low until the photodetector output signal D2 rises back above the transition-specific threshold TH2.

As the photodetector 122B passes from section S6 to section S7 (by virtue of the rotation of the codewheel relative to the light source and the photodetector module), the photodetector output signal D2 drops below the transition-specific threshold TH1. Once the photodetector output signal D2 drops below the transition-specific threshold TH1, the state signal W1 goes from high to low (e.g., from 1 to 0). The state signal W1 stays low until the photodetector output signal D2 rises back above the transition-specific threshold TH1.

As the photodetector 122B passes from section S7 to section S8 (by virtue of the rotation of the codewheel relative to the light source and the photodetector module), the photodetector output signal D2 drops below the transition-specific threshold TH0. Once the photodetector output signal D2 drops below the transition-specific threshold TH0, the state signal W0 goes from high to low (e.g., from 1 to 0). The state signal W0 stays low until the photodetector output signal D2 rises back above the transition-specific threshold TH0.

As the photodetector 122B passes from section S8 of the first interval of track B to section S5 of the second interval of track B, the photodetector output signal D2 rises back above all three of the transition-specific thresholds, TH0, TH1, and TH2. Once the photodetector output signal D2 rises above all three of the transition-specific thresholds, all three of the state signals W0, W1, and W2 go from low to high (e.g., from 0 to 1) and the above-described process repeats itself.

The state signals W0-W5, which represent the magnitude of the photodetector output signals D1 and D2 relative to the respective transition-specific thresholds TH0-TH5, are converted to digital position information. FIG. 6 is a matrix that illustrates an exemplary conversion of the state signals W0-W5 to digital position information. The matrix includes eight columns; six columns that identify the state signals W0, W1, W2, W3, W4, and W5, one column that identifies the corresponding sections of tracks A and B, and one column that identifies corresponding 4-bit digital position information. As illustrated in the matrix, when all of the state signals are high (e.g., 1, 1, 1, 1, 1, 1), the photodetector is aligned with optically distinguishable section S1 of track A and S5 of track B. In the embodiment of FIG. 6, this combination of signal states translates to a 4-bit digital position output of '0000'. When the state signals W0, W1, W3, W4, and W5 are high and state signal W2 is low (e.g., 1, 1, 1, 0, 1, 1), the photodetector is aligned with optically distinguishable sections S1 of track A and S6 of track B, which translates to a 4-bit digital position output of '0001'. Similar conversions are made for the fourteen other combinations of the sections in tracks A and B as illustrated in FIG. 6. Although a particular conversion scheme is depicted in FIG. 6, the conversion scheme can be established differently from the scheme of FIG. 6.

Figure 7:
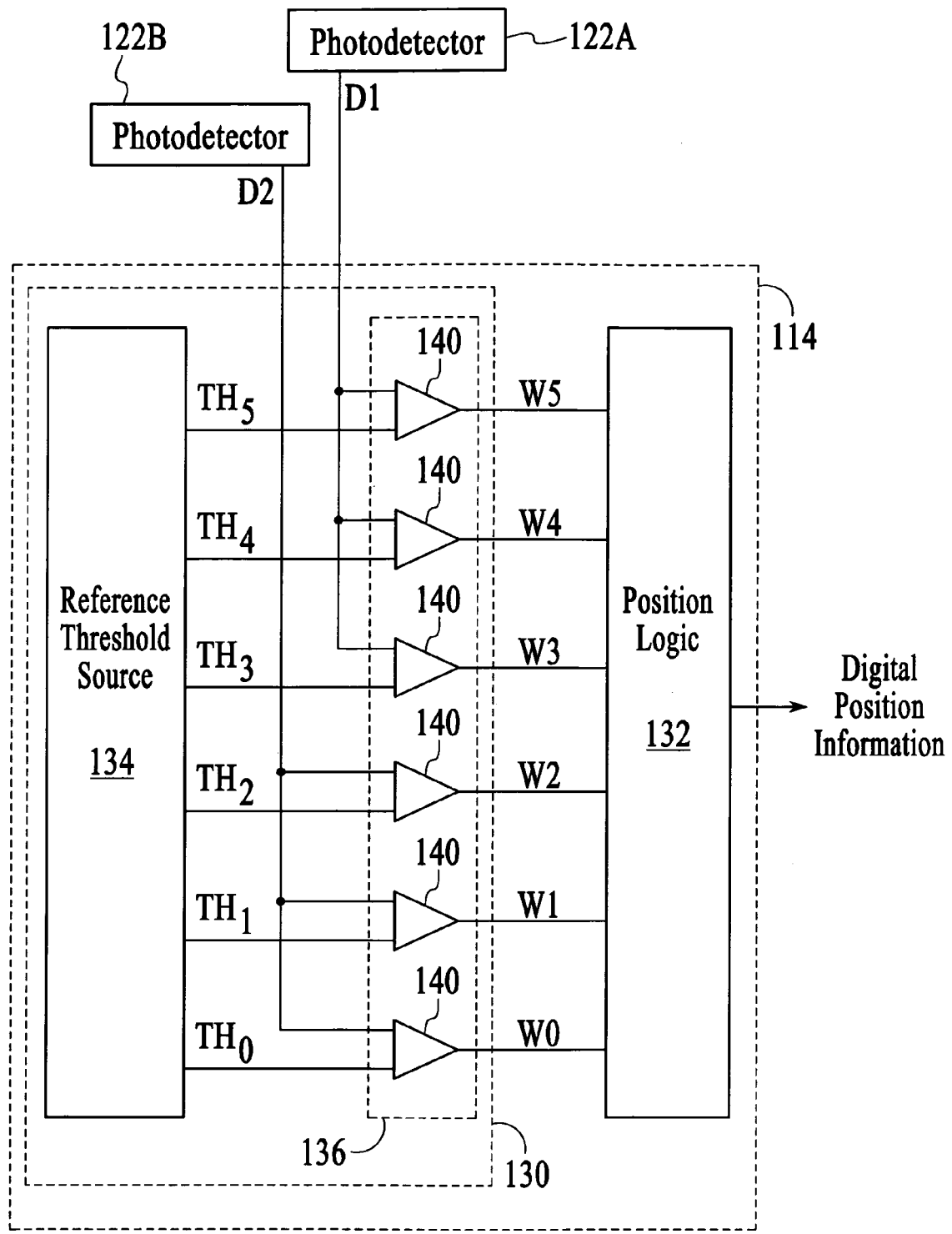
FIG. 7 depicts the photodetectors from FIG. 5A and an embodiment of the signal processor from FIG. 1, which can be used to implement the technique described above with reference to FIGS. 5A, 5B, and 6.

FIG. 7 depicts the photodetectors 122A and 122B from FIG. 5A and an embodiment of the signal processor 114 from FIG. 1, which can be used to implement the technique described above with reference to FIGS. 5A, 5B, and 6. The signal processor depicted in FIG. 7 includes threshold logic 130 and position logic 132. The threshold logic receives the photodetector output signals D1 and D2 and outputs the state signals W0-W5. The position logic receives the state signals W0-W5 and outputs digital position information.

In the embodiment of FIG. 7, the threshold logic 130 includes a reference threshold source 134 and a threshold comparator unit 136. The reference threshold source provides the transition-specific thresholds TH0, TH1, TH2, TH3, TH4, and TH5 to the threshold comparator unit. In an embodiment, the transition-specific thresholds are provided to the threshold comparator unit as voltage or current signals at the appropriate levels. The threshold comparator unit compares the transition-specific thresholds to the photodetector output signals D1 and D2. In the embodiment of FIG. 7, the threshold comparator unit includes six comparators 140, one for each transition-specific threshold. Each of the six comparators includes one input for receiving either photodetector output signal D1 or photodetector output signal D2 and one input for receiving a transition-specific threshold.

In operation, the six comparators 140 of the threshold comparator unit 136 compare the photodetector output signals D1 and D2 to the respective transition-specific threshold, TH0, TH1, TH2, TH3, TH4, and TH5. In response to the comparison, the comparators output the state signals W0, W1, W2, W3, W4, and W5 to the position logic and the position logic converts the state signals to digital position information. For example, the position logic converts the state signals to 4-bit digital values as described with reference to FIG. 6.

Optical encoders with six channels are commonly used, for example, with brushless motors. A 6-channel optical encoder typically includes:
1) A and B channels for determining rotational speed, position, and direction;
2) an index or "I" channel for indexing the rotation; and
3) U, V, and W channels for determining absolute position of the coding element.

In a conventional 6-channel optical encoder, the "UVW" channels require three separate U, V, and W tracks. While systems with three separate U, V, and W tracks work well to provide absolute position information, the number of tracks and the spacing between tracks requires significant amounts of space that add size to a 6-channel optical encoder.

Figure 8A:
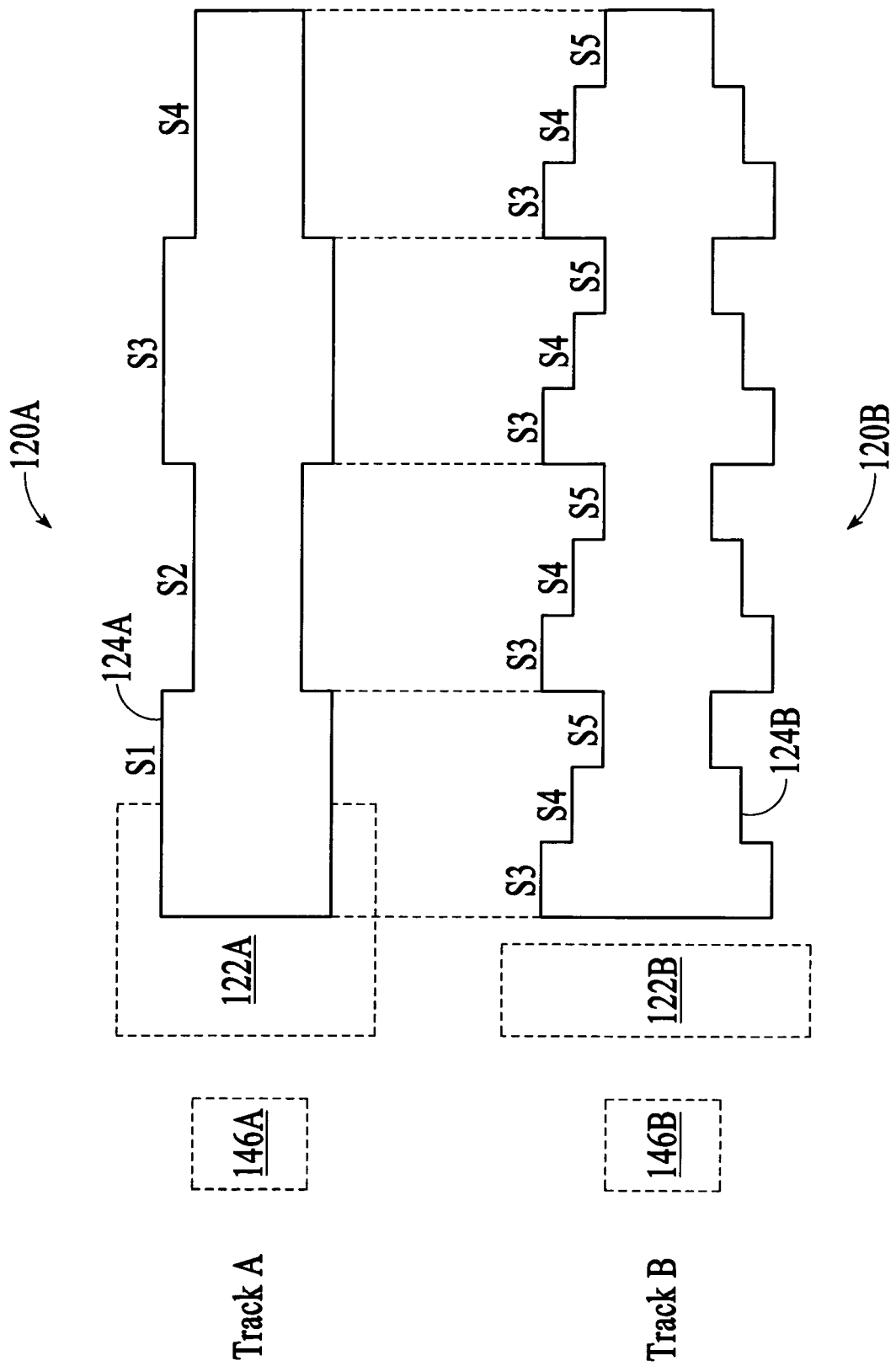
FIG. 8A depicts an exemplary embodiment of a two-track system that is configured to provide the UVW channels using two tracks instead of three tracks in accordance with an embodiment of the invention.

Similar concepts to those described above with reference to FIGS. 1-7 can be used to provide the UVW channels in a 6-channel optical encoder with fewer tracks than conventional systems. In particular, FIG. 8A depicts an exemplary embodiment of a two-track system that is configured to provide the UVW channels using two tracks instead of three tracks. With reference to FIG. 8A, a first track 120A, track A, has a track pattern 124A that includes a repeating pattern of two optically distinguishable sections, S1 and S2, similar to the track pattern described with reference to FIG. 2A except that there are two tracks instead of four. A second track 120B, track B, has a track pattern 124B that includes a repeating pattern of three optically distinguishable sections, S3, S4, and S5, in which the pattern repeats in two intervals over the span of one interval of the pattern of track A.

As depicted in FIG. 8A, the optically distinguishable sections of tracks A and B are aligned with each other such that each section of track A is aligned with one interval of track B. For example, one interval of optically distinguishable sections S3, S4, and S5 of track B is aligned with optically distinguishable section S1 of track A and one interval of optically distinguishable sections S3, S4, and S5 of track B is aligned with optically distinguishable section S2 of track A.

A photodetector 122A corresponds to track A and a photodetector 122B corresponds to track B. The photodetectors and track patterns are configured similar to that described above with reference to FIG. 2A such that the transitions between the optically distinguishable sections of the track patterns can be identified by comparing the corresponding photodetector output signals to the corresponding transition-specific thresholds. Further, the configurations of the track patterns and the photodetectors relative to each other have similar design requirements to those described above with reference to FIGS. 2A-7. In addition to photodetectors 122A and 122B, track A includes photodetector 146A and track B includes photodetector 146B. These photodetectors are used to produce the transition-specific thresholds as described below. In an embodiment, the height dimension of photodetectors 146A and 146B should be less than the height dimension of the smallest section of the respective track and the width dimension the photodetectors 146A and 146B should be less than the width dimension of any section in the respective track. Photodetectors 146A and 146B enable the system to deal with degradation of light that may be caused, for example, by ink mist and/or dirt covering the light source and/or codewheel and light source degradation. In particular, the photodetectors 146A and 146B experience essentially the same degree of light degradation as the photodetectors 122A and 122B.

Figures 8B, 9:
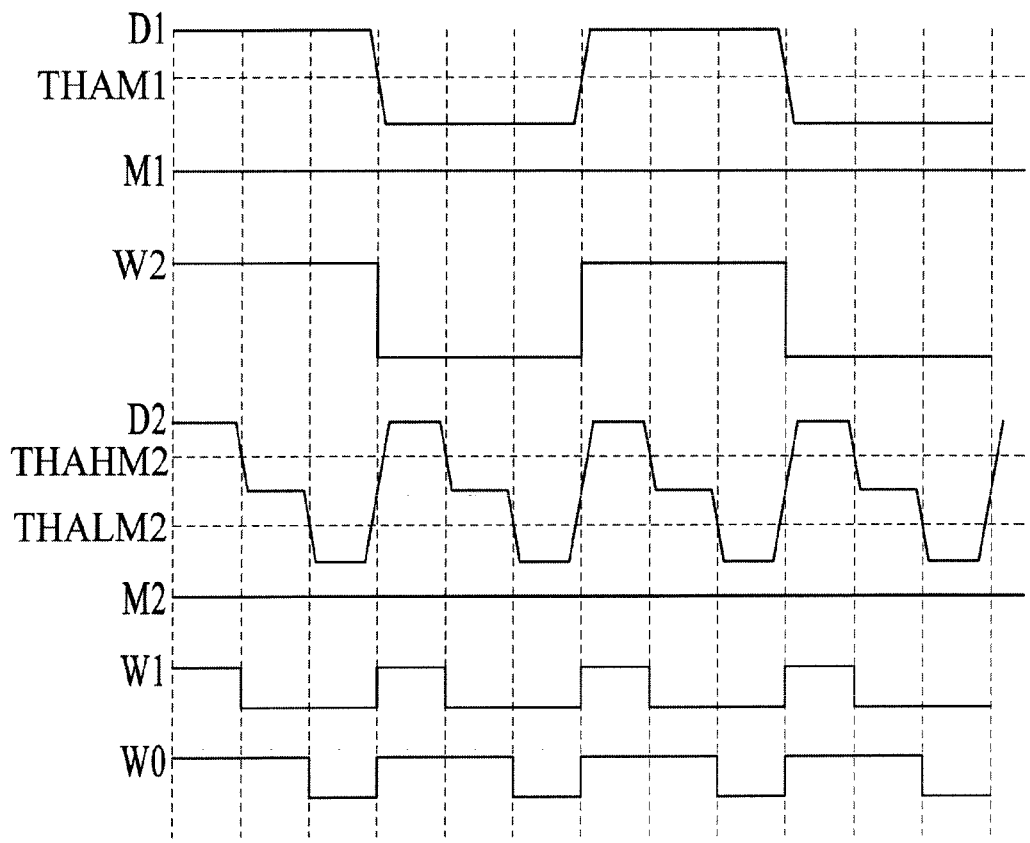
FIG. 8B depicts a wave diagram that is generated as the track patterns of tracks A and B from FIG. 8A move relative to the photodetectors.
FIG. 9 is a matrix that illustrates an exemplary conversion of the state signals W0, W1, and W2 from FIG. 8B to UVW digital position information.

FIG. 8B depicts a wave diagram that is generated as the track patterns of tracks A and B move relative to the photodetectors. The waveforms in the wave diagram are time aligned with the track patterns and include the photodetector output signals D1 and D2 and state signals W0, W1, and W2, where state signal W0 is an indication of the photodetector output signal relative to the transition-specific threshold THALM2, state signal W1 is an indication of the photodetector output signal relative to the transition-specific threshold THAHM2, and state signal W2 is an indication of the photodetector output signal relative to the transition-specific threshold THAM1.

In the embodiment of FIG. 8B, the transition-specific threshold THAM1 corresponds to the transition between optically distinguishable sections S1 and S2 of track A, the transition-specific threshold THAHM2 corresponds to the transition between optically distinguishable sections S3 and S4 of track B, and the transition-specific threshold THALM2 corresponds to the transition between optically distinguishable sections S4 and S5 of track B. As described above, the transition-specific thresholds are established at levels that are in between the level of the photodetector output signal when the respective photodetector is aligned with the section immediately before the transition and the level of the photodetector output signal when the respective photodetector is aligned with the section immediately following the transition.

In the embodiment of FIG. 8B, the state signals W0-W2 are digital signals that are high (e.g., 1) when the photodetector output signals D1 and D2 are above the respective transition-specific threshold and low (e.g., 0) when the photodetector output signals D1 and D2 are below the respective transition-specific threshold. Although one convention for the state signals is described, other conventions are possible.

In operation, first with reference to track A 120A, the photodetector output signal D1 is initially above transition-specific threshold THAM1 and therefore state signal W2 is high (e.g., 1). As the photodetector passes from section S1 to section S2 (by virtue of the rotation of the codewheel relative to the light source and the photodetector module), the photodetector output signal D1 drops below the transition-specific threshold THAM1. Once the photodetector output signal D1 drops below the transition-specific threshold THAM1, the state signal W2 goes from high to low (e.g., from 1 to 0). The state signal W2 stays low until the photodetector output signal D1 rises back above the transition-specific threshold THAM1.

As the photodetector 122A passes from section S2 of the first interval of track A to section S1 of the next interval of track A, the photodetector output signal D1 will rise back above the transition-specific threshold THAM1. Once the photodetector output signal D1 rises above the transition-specific threshold, state signal W2 goes from low to high (e.g., from 0 to 1) and the above-described process repeats itself.

Second, with reference to track B 120B, the photodetector output signal D2 is initially above transition-specific thresholds THALM2 and THAHM2 and therefore state signals W0 and W1 are high (e.g., 1). As the photodetector passes from section S3 to section S4 (by virtue of the rotation of the codewheel relative to the light source and the photodetector module), the photodetector output signal D2 drops below the transition-specific threshold THAHM2. Once the photodetector output signal D2 drops below the transition-specific threshold THAHM2, the state signal W1 goes from high to low (e.g., from 1 to 0). The state signal W1 stays low until the photodetector output signal D2 rises back above the transition-specific threshold THAHM2.

As the photodetector 122B passes from section S4 to section S5 (by virtue of the rotation of the codewheel relative to the light source and the photodetector module), the photodetector output signal D2 drops below the transition-specific threshold THALM2. Once the photodetector output signal D2 drops below the transition-specific threshold THALM2, the state signal W0 goes from high to low (e.g., from 1 to 0). The state signal W0 stays low until the photodetector output signal D2 rises back above the transition-specific threshold THALM2.

As the photodetector 122B passes from section S5 of the first interval of track B to section S3 of the second interval of track B, the photodetector output signal D2 rises back above the transition-specific thresholds, THALM2 and THAHM2. Once the photodetector output signal D2 rises above the transition-specific thresholds, the state signals W0 and W1 go from low to high (e.g., from 0 to 1) and the above-described process repeats itself.

The state signals W1 and W2, which represent the magnitude of the photodetector output signals D1 and D2 relative to the respective transition-specific thresholds, are converted to digital position information. FIG. 9 is a matrix that illustrates an exemplary conversion of the state signals W0, W1, and W2 to UVW digital position information. The matrix includes seven columns; three columns that identify the state signals W0, W1, and W2, one column that identifies the corresponding sections of tracks A and B, and three columns that identify corresponding UVW digital position information. As illustrated in the matrix, when all of the state signals are high (e.g., 1, 1, 1), the photodetector is aligned with optically distinguishable section S1 of track A and S3 of track B. In the embodiment of FIG. 6, this combination of signal states translates to a UVW digital position output of '101'. When the state signals W0 and W2 are high and state signal W1 is low (e.g., 1, 0, 1), the photodetector is aligned with optically distinguishable sections S1 of track A and S4 of track B, which translates to a UVW digital position output of '100'. Similar conversions are made for the four other combinations of the sections in tracks A and B as illustrated in FIG. 9. Although a particular conversion scheme is depicted in FIG. 9, the conversion scheme can be established differently from the scheme of FIG. 9.

Figure 10:
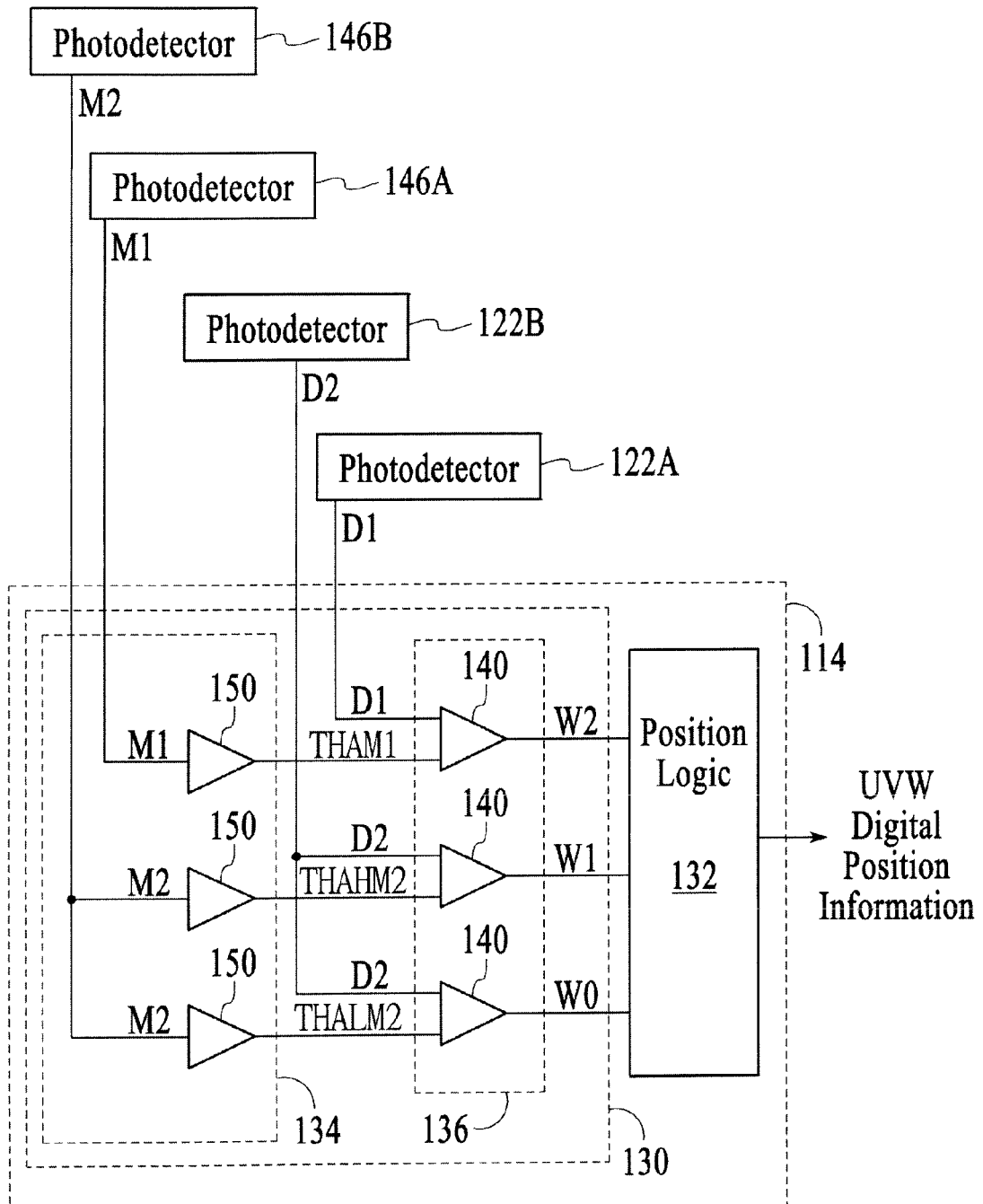
FIG. 10 depicts the photodetectors from FIG. 8A and an embodiment of the signal processor from FIG. 1, which can be used to implement the technique described above with reference to FIGS. 8A, 8B, and 9.

FIG. 10 depicts the photodetectors 122A, 122B, 146A, and 146B from FIG. 8A and an embodiment of the signal processor 114 from FIG. 1, which can be used to implement the technique described above with reference to FIGS. 8A, 8B, and 9. The signal processor depicted in FIG. 10 includes threshold logic 130 and position logic 132. The threshold logic receives the photodetector output signals D1, D2, M1, and M2 and outputs the state signals W0, W1, and W2. The position logic receives the state signals W0, W1, and W2 and outputs UVW digital position information.

In the embodiment of FIG. 10, the threshold logic 130 includes a reference threshold source 134 and a threshold comparator unit 136. The reference threshold source provides the transition-specific thresholds THAM1, THAHM2, and THALM2 to the threshold comparator unit. In an embodiment, the reference threshold source receives outputs from photodetectors 146A and 146B and amplifies the outputs at respective amplifiers 150 to produce the transition-specific thresholds THAM1, THAHM2, and THALM2. In the embodiment of FIG. 10, the transition-specific threshold THAHM2 is amplified higher than the transition-specific threshold THALM2 (see FIG. 8B). The transition-specific thresholds are provided to the threshold comparator unit as voltage or current signals at the appropriate levels. The threshold comparator unit compares the transition-specific thresholds to the photodetector output signals D1 and D2. In the embodiment of FIG. 10, the threshold comparator unit includes three comparators, one for each transition-specific threshold. Each of the three comparators includes one input for receiving either photodetector output signal D1 or photodetector output signal D2 and one input for receiving a transition-specific threshold.

In operation, the three comparators of the threshold comparator unit compare the photodetector output signals D1 and D2 to the respective transition-specific threshold, THAM1, THAHM2, and THALM2. In response to the comparison, the comparators output the state signals W0, W1, and W2 to the position logic and the position logic converts the state signals to UVW digital position information. For example, the position logic converts the state signals to UVW digital values as described with reference to FIG. 9. In the embodiment described with reference to FIGS. 8A-10, the tracks of the codewheel are designed to correspond to mechanical poles of an electric motor.

It should be noted that the codewheel could be replaced with a coding element that is not a wheel. For example, linear coding element, such as a code strip, could be used. Further, although FIG. 1 relates to determining the absolute position of a shaft, the absolute position information can be related to an element other than a shaft.

Figure 11A:
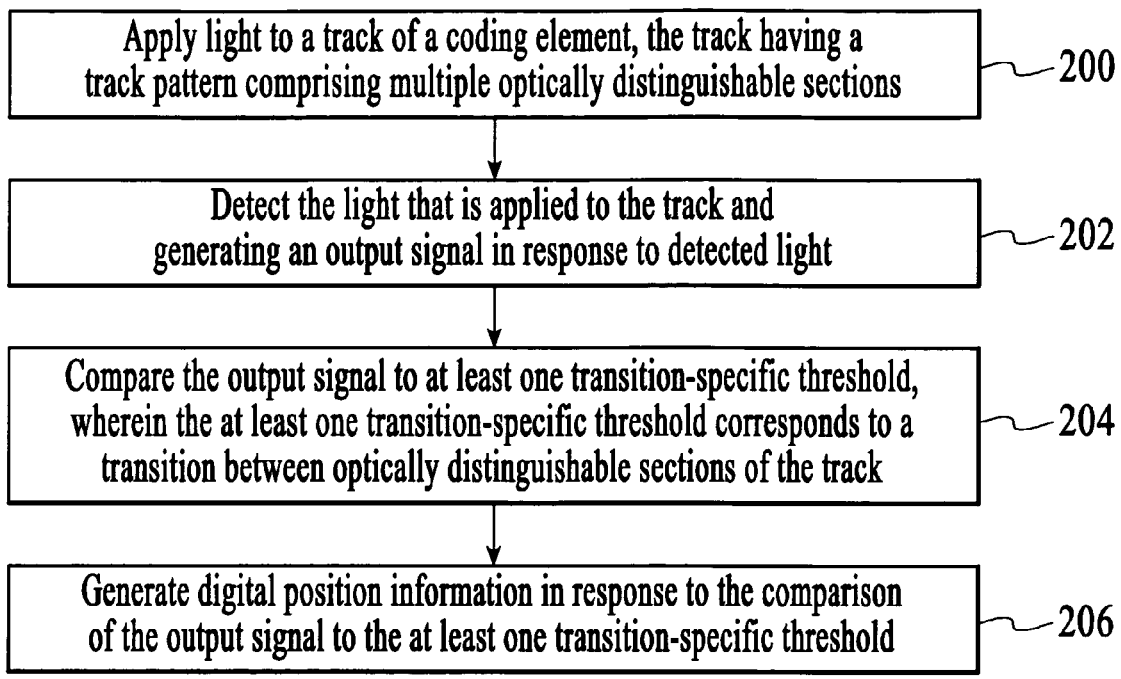
FIG. 11A is a process flow diagram of a method for generating absolute position information using an optical encoder in accordance with an embodiment of the invention.

FIG. 11A is a process flow diagram of a method for generating absolute position information using an optical encoder in accordance with an embodiment of the invention. At block 200, light is applied to a track of a coding element, the track having a track pattern comprising multiple optically distinguishable sections. At block 202, the light that is applied to the track is detected and an output signal is generated in response to detected light. At block 204, the output signal is compared to at least one transition-specific threshold, wherein the at least one transition-specific threshold corresponds to a transition between optically distinguishable sections of the track. At block 206, digital position information is generated in response to the comparison of the output signal to the at least one transition-specific threshold.

Figure 11B:
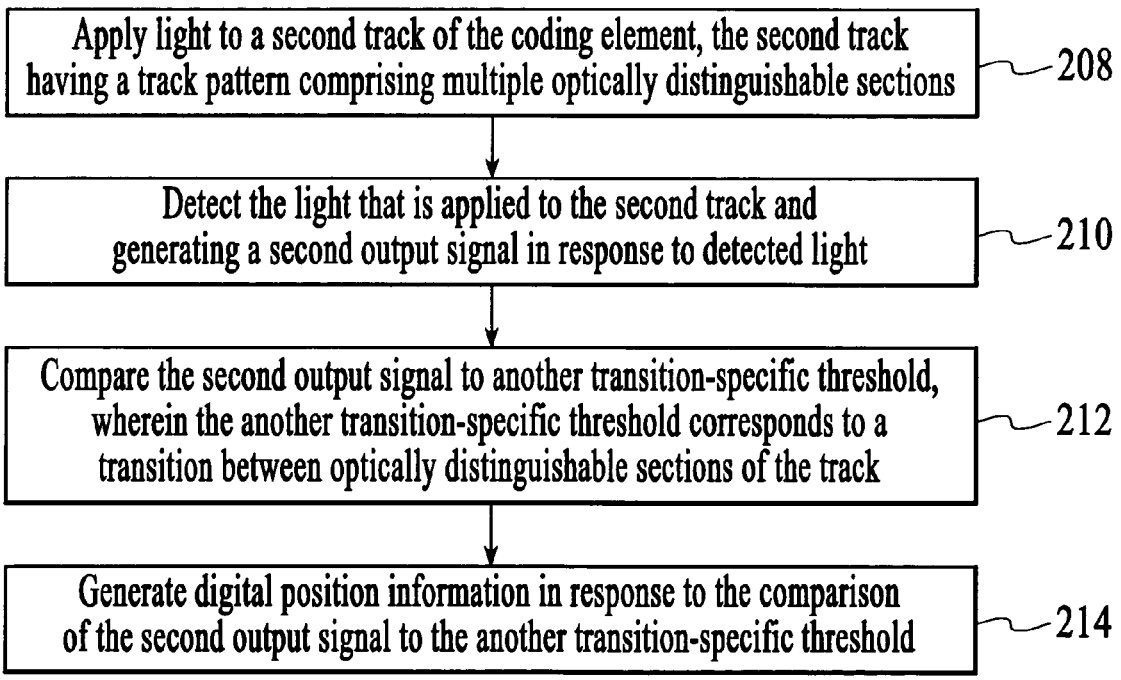
FIG. 11B is a continuation of the process flow diagram of FIG. 11A.

Referring to FIG. 11B, in a further embodiment of the method, at block 208, light is applied to a second track of the coding element, the second track having a track pattern comprising multiple optically distinguishable sections. At block 210, the light that is applied to the second track is detected and a second output signal is generated in response to detected light. At block 212, the second output signal is compared to another transition-specific threshold, wherein the another transition-specific threshold corresponds to a transition between optically distinguishable sections of the second track. At block 214, digital position information is generated in response to the comparison of the second output signal to the another transition-specific threshold.

In an embodiment, a photodetector includes one or more photodiodes. In an embodiment, the track or tracks and respective photodetectors are radially aligned such that the photodetectors are in the middle of the corresponding track. Radially aligning the photodetectors in the middle of the corresponding track balances the alignment tolerance on both sides of the photodetector array.

Although specific embodiments of the invention have been described and illustrated, the invention is not to be limited to the specific forms or arrangements of parts as described and illustrated herein. The invention is limited only by the claims.

What is claimed is:

1. An optical encoder comprising:
  a coding element having a track with a track pattern, the track pattern comprising multiple optically distinguishable sections;
  a light source configured to output light to the track;
  a photodetector positioned to detect light from the light source that is associated with the track, the photodetector generating an output signal in response to detected light;
  threshold logic configured to indicate the magnitude of the output signal relative to at least one transition-specific threshold value, wherein the at least one transition-specific threshold value corresponds to a transition between optically distinguishable sections of the track; and
  position logic configured to generate digital position information in response to the indication from the threshold logic.

2. The optical encoder of claim 1 further comprising:
  a second track with a track pattern, the track pattern comprising multiple optically distinguishable sections;
  a second photodetector that is associated with the second track, the second photodetector positioned to detect light from the light source and to generate an output signal in response to the detected light;
  wherein the threshold logic is further configured to indicate the magnitude of the output signal from the second photodetector relative to at least one transition-specific threshold value, wherein the at least one transition-specific threshold value corresponds to a transition between optically distinguishable sections of the second track; and
  wherein the position logic is further configured to generate the digital position information in response to the indications related to the second track.

3. The optical encoder of claim 1 wherein the optically distinguishable sections of the track pattern have width dimensions that are greater than the width dimension of the photodetector.

4. The optical encoder of claim 1 wherein the optically distinguishable sections of the track pattern have height dimensions that are less than the height dimension of the photodetector.

5. The optical encoder of claim 1 further comprising a threshold source configured to provide the transition-specific threshold value.

6. The optical encoder of claim 5 wherein the threshold source comprises a photodetector positioned to detect light from the light source that is associated with the track.

7. The optical encoder of claim 1 wherein the threshold logic includes a transition-specific comparator to indicate the magnitude of the output signal relative to the at least one transition-specific threshold value.

8. An optical encoder comprising:
  a coding element having first and second tracks, the first and second tracks both having a track pattern comprising multiple optically distinguishable sections;
  a light source configured to output light to the first and second tracks;
  a first photodetector that is associated with the first track, the first photodetector positioned to detect light from the light source and to generate a first output signal in response to the detected light;
  a second photodetector that is associated with the second track, the second photodetector positioned to detect light from the light source and to generate a second output signal in response to the detected light;
  threshold logic configured to indicate the magnitude of the output signals from the first and second photodetectors relative to transition-specific threshold values, wherein the transition-specific threshold values correspond to transitions between optically distinguishable sections of the first and second tracks; and
  position logic configured to generate digital position information in response to the indications from the threshold logic.

9. The optical encoder of claim 8 wherein the digital position information generated by the position logic is UVW information.

10. The optical encoder of claim 8 wherein the first track includes a repeating pattern of two optically distinguishable sections and the second track includes a repeating pattern of three optically distinguishable sections.

11. The optical encoder of claim 10 wherein the threshold logic includes three transition-specific comparators for comparing the output signals to the transition-specific threshold values.

12. The optical encoder of claim 11 wherein:
a first one of the transition-specific comparators compares the first output signal with a first transition-specific threshold value;
a second one of the transition-specific comparators compares the second output signal with a second transition-specific threshold value; and
a third one of the transition-specific comparators compares the second output signal with a third transition-specific threshold value.

13. The optical encoder of claim 12 wherein the digital position information generated by the position logic is UVW information.

14. The optical encoder of claim 8 further comprising at least one threshold source configured to provide a transition-specific threshold value, wherein the threshold source comprises a photodetector positioned to detect light from the light source that is associated with the track.

15. The optical encoder of claim 8 wherein the optically distinguishable sections of the track pattern have width dimensions that are greater than the width dimension of the photodetector.

16. The optical encoder of claim 8 wherein the optically distinguishable sections of the track pattern have height dimensions that are less than the height dimension of the photodetector.

17. A method for generating absolute position information using an optical encoder, the method comprising:
applying light to a track of a coding element, the track having a track pattern comprising multiple optically distinguishable sections;
detecting the light that is applied to the track and generating an output signal in response to detected light;
comparing the output signal to at least one transition-specific threshold value, wherein the at least one transition-specific threshold value corresponds to a transition between optically distinguishable sections of the track; and
generating digital position information in response to the comparison of the output signal to the at least one transition-specific threshold value.

18. The method of claim 17 further comprising:
applying light to a second track of the coding element, the second track having a track pattern comprising multiple optically distinguishable sections;
detecting the light that is applied to the second track and generating a second output signal in response to detected light;
comparing the second output signal to another transition-specific threshold value, wherein the another transition-specific threshold value corresponds to a transition between optically distinguishable sections of the second track; and
generating digital position information in response to the comparison of the second output signal to the another transition-specific threshold value.

19. The method of claim 18 further comprising generating UVW digital position information from the comparisons.

20. The method of claim 18 further comprising converting the results of the comparison to digital position information.

* * * * *